United States Patent
Zomet et al.

(10) Patent No.: US 7,651,282 B2
(45) Date of Patent: Jan. 26, 2010

(54) DEVICES AND METHODS FOR ELECTRONICALLY CONTROLLING IMAGING

(75) Inventors: Asaf Zomet, Jerusalem (IL); Shree K. Nayar, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 439 days.

(21) Appl. No.: 11/417,864

(22) Filed: May 4, 2006

(65) Prior Publication Data

US 2007/0081815 A1    Apr. 12, 2007

Related U.S. Application Data

(60) Provisional application No. 60/678,002, filed on May 4, 2005.

(51) Int. Cl.
G03B 9/04 (2006.01)
G02F 1/00 (2006.01)

(52) U.S. Cl. .................................. 396/457; 396/459

(58) Field of Classification Search ............. 396/457, 396/459, 471; 355/55, 67
See application file for complete search history.

(56) References Cited

U.S. PATENT DOCUMENTS

| | | | |
|---|---|---|---|
| 4,206,965 A | 6/1980 | McGrew | |
| 4,878,735 A | 11/1989 | Vilums | |
| 4,890,902 A | 1/1990 | Doane et al. | |
| 5,032,003 A | 7/1991 | Antes | |
| 5,132,839 A | 7/1992 | Travis | |
| 5,216,528 A | 6/1993 | Honda et al. | |
| 5,410,345 A | 4/1995 | Eichenlaub | |
| 5,465,175 A | 11/1995 | Woodgate et al. | |
| 5,616,912 A * | 4/1997 | Robinson et al. | ......... 250/201.1 |
| 5,764,317 A | 6/1998 | Sadovnik | |
| 5,831,765 A | 11/1998 | Nakayama | |
| 5,959,704 A | 9/1999 | Suzuki et al. | |
| 6,040,807 A | 3/2000 | Hamagishi et al. | |
| 6,183,089 B1 | 2/2001 | Tehrani | |
| 6,229,561 B1 | 5/2001 | Son et al. | |

(Continued)

FOREIGN PATENT DOCUMENTS

JP    2001-133918    5/2001

(Continued)

OTHER PUBLICATIONS

Adelson et al., "Pyramid Method in Image Processing," RCA Engineer, 29(6):33-41, 1984.

(Continued)

Primary Examiner—Rodney E Fuller
(74) Attorney, Agent, or Firm—Byrne Poh LLP

(57) ABSTRACT

In some embodiments, a device includes a light modulator layer having a plurality of elements, each having a controllable transmittance, and a plurality of lenses, wherein each of the plurality of lenses is disposed to receive light independently of each other. The device further includes an image detector disposed at a distance from the light modulator layer and configured to acquire images from light that passes through the light modulator layer. In addition, the device includes a controller configured to control transmittance of the elements of the light modulator layer. Methods of acquiring images are also provided.

27 Claims, 14 Drawing Sheets

U.S. PATENT DOCUMENTS

| | | |
|---|---|---|
| 6,262,694 B1 | 7/2001 | Ishimoto et al. |
| 6,304,263 B1 | 10/2001 | Chiabrera et al. |
| 6,525,847 B2 | 2/2003 | Popovich et al. |
| 6,795,241 B1 | 9/2004 | Holzbach |
| 6,801,354 B1 | 10/2004 | Payne et al. |
| 2002/0008674 A1 | 1/2002 | Son et al. |
| 2003/0052836 A1 | 3/2003 | Matsumoto |
| 2003/0107805 A1 | 6/2003 | Street |

FOREIGN PATENT DOCUMENTS

| | | |
|---|---|---|
| JP | 2004-077937 | 3/2004 |
| JP | 2004144874 | 5/2004 |

OTHER PUBLICATIONS

Bergen et al., "Hierarchical Model-Based Motion Estimation," European Conf. on Computer Vision, pp. 237-252, 1992.

Gat, "Imaging Spectroscopy Using Tunable Filters: A Review," Proc. SPIE Conf. Algorithms for Multispectral and Hyperspectral Imagery VI, Apr. 2000.

Irani et al., "Robust Multi-Sensor Image Alignment," Int. Conf. on Computer Vision, pp. 959-966, Jan. 1998.

Mielenz, "On the Diffraction Limit for Lensless Imaging," J. of Research of the Nat. Inst. of Stands. and Tech., 104 (5):479-485, 1990.

Nayar and Branzoi, "Adaptive Dynamic Range Imaging: Optical Control of Pixel Exposures Over Space and Time," Int. Conf. on Computer Vision, pp. 1168-1175, 2003.

Poger et al., "Selecting Components for Building Multispectral Sensors," IEEE CVPR Technical Sketches, Dec. 2001.

Viola et al., "Alignment by Maximation of Mutual Information," Int. J. of Computer Vision, 24(2):137-154, Sep. 1997.

* cited by examiner

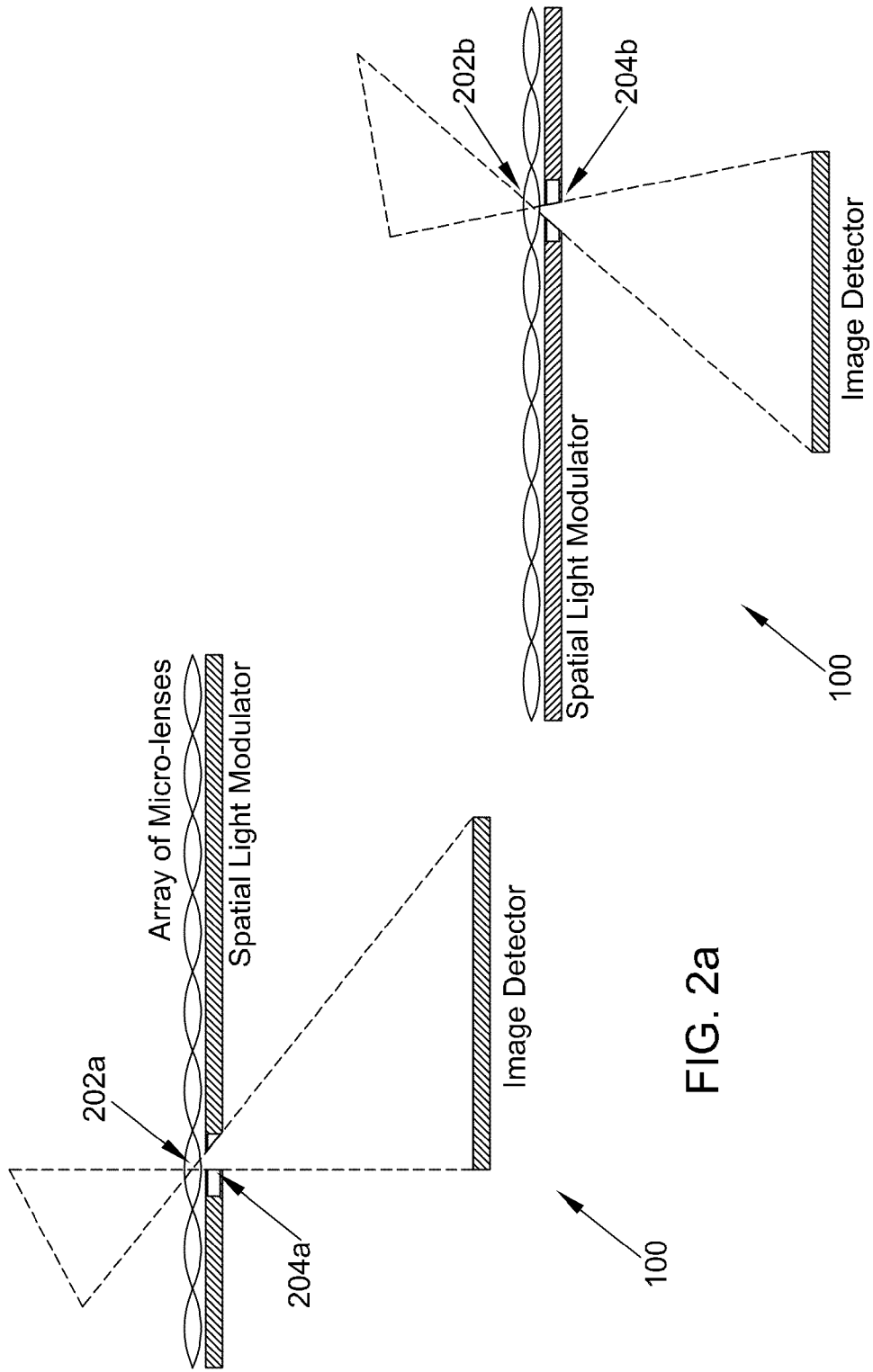

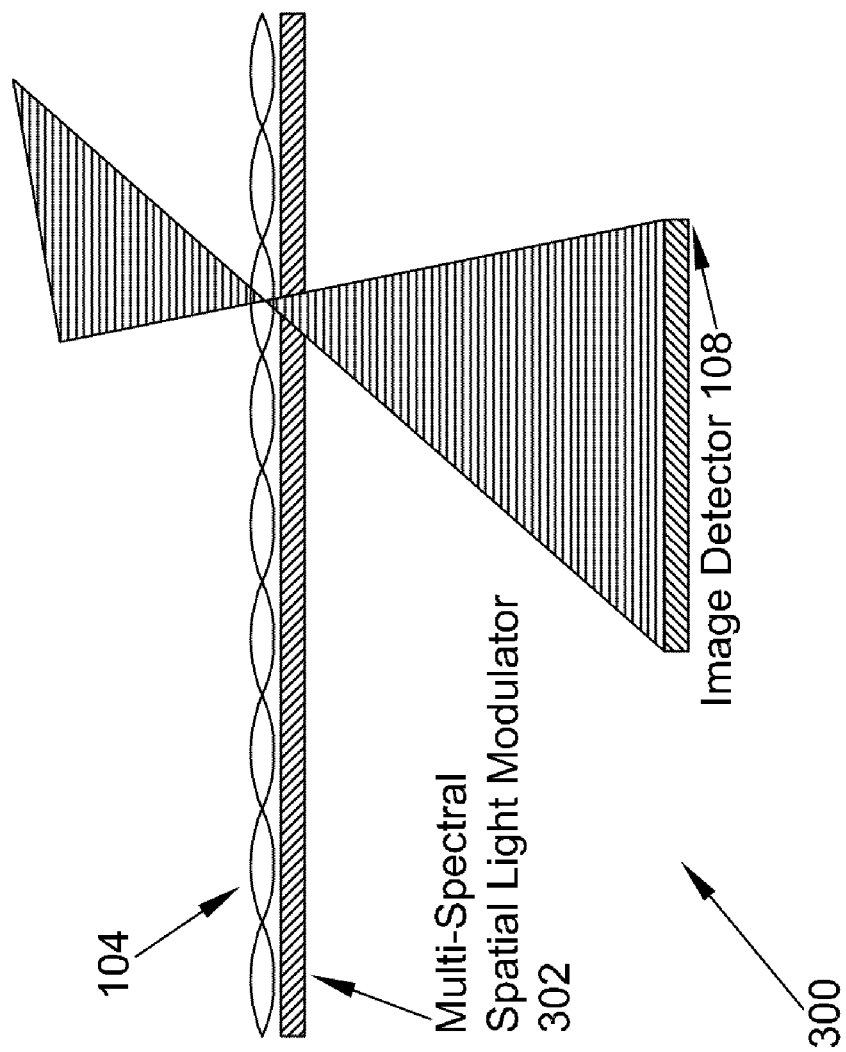

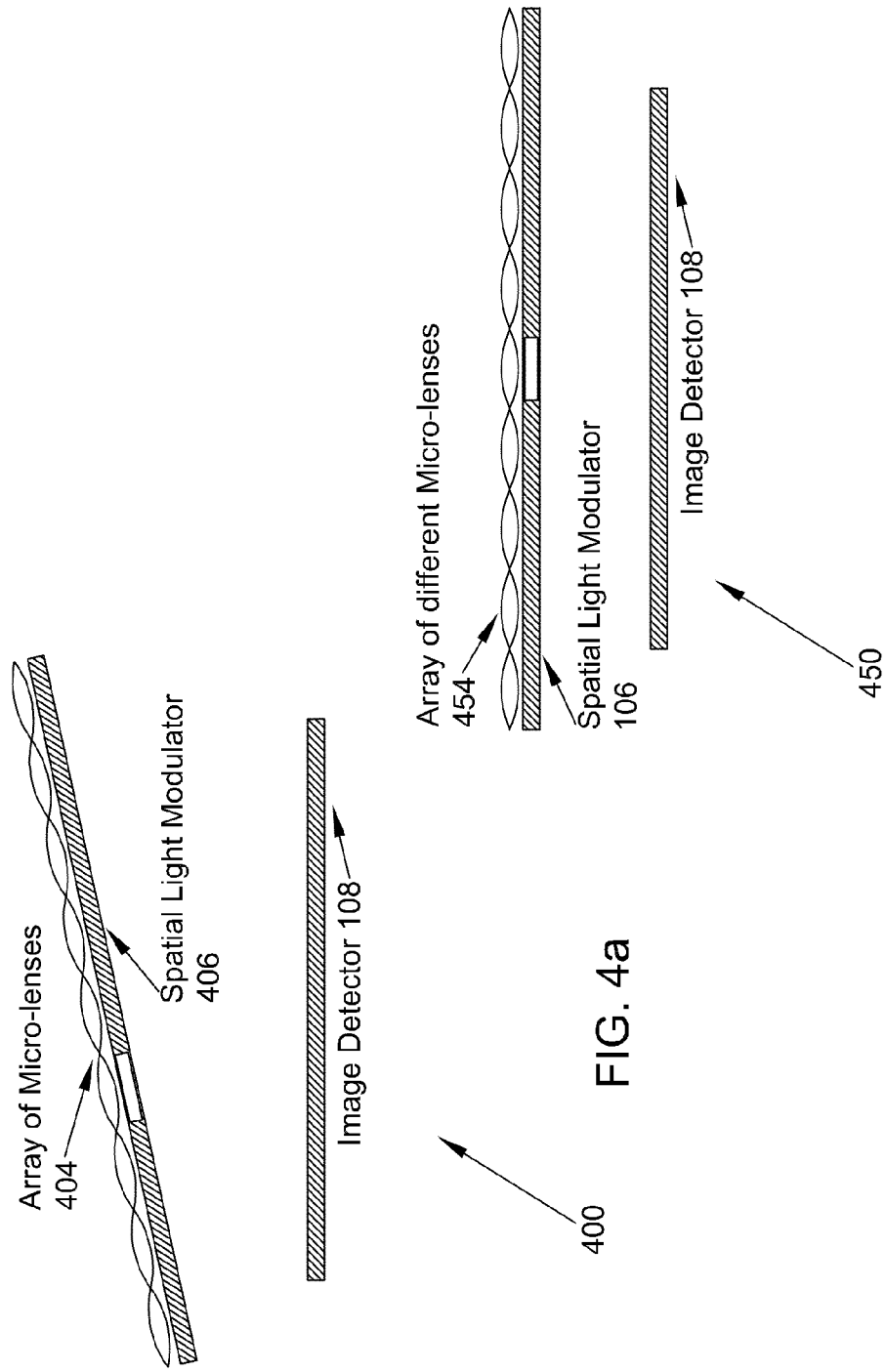

DEVICES AND METHODS FOR ELECTRONICALLY CONTROLLING IMAGING

CROSS-REFERENCE TO RELATED APPLICATION

This application claims priority under 35 U.S.C. § 119(e) from U.S. Provisional Patent Application No. 60/678,002, filed on May 4, 2005, which is hereby incorporated by reference in its entirety.

STATEMENT REGARDING FEDERALLY SPONSORED RESEARCH OR DEVELOPMENT

The government may have certain rights in the present invention pursuant to a grant by the NSF/ITR, Grant No. ITR-00-85864.

FIELD OF THE INVENTION

The present invention relates to imaging systems and methods. More particularly, embodiments of the present invention relate to devices and methods for electronically controlling imaging using an array of lenses and a light modulator.

BACKGROUND OF THE INVENTION

There has been a growing need for automated systems that use cameras to analyze a surrounding environment. In many applications, it is desirable that a system can dynamically change the viewing direction of the camera, and/or capture multiple moving objects with high resolution. The conventional solution is to use mechanical pan-tilt-zoom cameras, which are cameras that change their viewing direction using motors that physically rotate the cameras. Variable zoom can be achieved by mechanically moving the lenses.

The conventional solution, however, has several limitations. First, due to mechanical constraints, it is difficult to achieve a prompt and accurate change of the viewing direction or of the zoom factor from one video frame to the next. Second, the continuous changes of imaging properties introduce motion blur into the captured video image. Third, the motors tend to wear after long or repetitive usage, which poses a particularly significant problem for systems whose maintenance is expensive or for systems deployed in inaccessible locations. Finally, cameras today are restricted to acquiring images with a continuous field of view. Therefore, for a camera to simultaneously capture multiple objects that are of a distance from each other, the camera must maintain a wide field of view and, hence, acquire images of the objects with lower resolution. To overcome this limitation, conventional systems use multiple cameras, which results in complex designs and higher prices.

Therefore, an imaging device that can acquire images with disjointed fields of view, and can dynamically change its viewing direction, zoom factor, and/or other imaging properties without physically moving the components of the device is highly desirable. The present invention is directed to these and other important objectives.

SUMMARY OF THE INVENTION

Embodiments of the present invention provide imaging devices whose imaging properties can be changed dramatically and accurately from one video frame to the next. Devices of the present invention do not use motors to move its components; all changes in imaging properties can be controlled electronically. In addition, devices of the present invention can acquire images with disjointed or split fields of view. Therefore, the devices can acquire images of objects of interest with higher resolution without acquiring the regions in between the objects. Moreover, devices of the present invention can acquire images of objects simultaneously with different zoom magnifications. Devices of the present invention also offer other flexible imaging properties. In some embodiments, the devices can be programmed to acquire multi-spectral videos or high dynamic range videos using a grayscale detector with low dynamic range.

According to various embodiments, an optical device of the present invention can include a first light modulator layer having a plurality of elements, each having a transmittance, wherein the transmittance of each of the plurality of elements is controllable. The device also can include a plurality of lenses, wherein each of the plurality of lenses is disposed to receive light independently of each other, and an image detector disposed at a distance from the light modulator layer, the image detector configured to acquire at least one image from light that passes through the first light modulator layer. In addition, the device can include a controller configured to control transmittance of the plurality of elements of the light modulator layer.

In some embodiments, the lenses of the device are arranged on a layer parallel to the light modulator layer. In some embodiments, the light modulator layer comprises a liquid crystal sheet. Alternatively, the light modulator layer can comprise a digital micromirror device, or a liquid crystal on silicon device. In some embodiments, the lenses are arranged on a planar grid. Alternatively, the lenses can be arranged on a line.

In some embodiments, the transmittance of each of the elements of the light modulator layer is controllable between at least one state that is translucent and at least one state that is opaque. In some embodiments, the light modulator layer is disposed within the plurality of lenses.

In some embodiments, the light modulator layer comprises at least one multi-spectral spatial light modulator. The multi-spectral spatial light modulator can comprise a liquid-crystal tunable filter. In some embodiments, the lenses of the device are associated with different focal planes. For example, the lenses can be arranged on a plane that is slanted with respect to the image detector, or on a curved sheet. Alternatively, the lenses can be associated with different focal lengths.

In some embodiments, the controller of the device is further configured to create one or more aperture within the light modulator layer, the aperture comprising at least one element of the light modulator layer having a higher transmittance than elements surrounding the aperture. The aperture can be collocated with a lens, allowing light that enters the lens to pass through the light modulator layer. In some embodiments, the controller is further configured to change the location of the aperture and collocate the aperture with a second lens.

In some embodiments, the device includes at least one additional light modulator layer disposed at a distance from the first light modulator layer, and the controller is further configured to create one ore more apertures on the at least one additional light modulator layer. In one embodiment, the light modulator layers form a plurality of disjointed fields of view. In another embodiment, the first light modulator layer includes multi-spectral spatial light modulators, and the controller is further configured to create one or more addition apertures on the first light modulator layer, and control the multi-spectral spatial light modulators to associate different spectral responses with the apertures on the first light modulator layer. In yet another embodiment, the controller is configured to create multiple apertures on the first light modulator layer and associate different attenuation with the apertures. In one embodiment, the lenses of the device are associated with different focal planes, and the controller is configured to create multiple apertures on the first light modulator layer, and simultaneously form a plurality of images corresponding to the different focal planes on different regions of the image detector.

In some embodiments, the device is configured to acquire at different time instances a series of images and combine the images to form a video. In some embodiments, the device further includes multiple additional lenses, an additional light modulator layer coupled with the additional lenses, a mirror configured to redirect light that passes through the additional light modulator layer, and a beam splitter configured to combine light from the mirror and light from the first light modulator layer to form at least one image on the image detector.

Embodiments of the present invention also provide methods for acquiring images. In some embodiments, a method comprises controlling transmittance of elements of a first light modulator layer to create one or more apertures collocated with one or more lens, wherein the distances between each of the lenses and the light modulator layer are substantially equal, and acquiring one or more images using an image detector with light that passes through the lens. In some embodiments, the method can further includes controlling the first light modulator layer to create at least one additional aperture collocated with at least one additional lens, controlling a second light modulator layer disposed at a distance from the first light modulator layer to form a plurality of disjointed fields of view, and acquiring at least one image containing the plurality of disjointed fields of view using the image detector.

In other embodiments, the method can further include controlling the first light modulator layer to create at least one additional aperture collocated with the at least one additional lens, and controlling a second light modulator layer disposed at a distance from the first light modulator layer to create an aperture on the second light modulator layer, such that each of a plurality of regions of the image detector receives only light that passes through a single lens, wherein the plurality of regions are associated with overlapping fields of view. In addition, the method includes acquiring an image having a plurality of regions associated with overlapping fields of view using the image detector. In one embodiment, the method further includes controlling elements of the first light modulator layer to associate the apertures on the first light modulator layer with different filter settings, and combining the regions of the acquired image to create a multi-spectral image. In another embodiment, regions of the acquired image are associated with different focal planes, and the method further includes combining the plurality of regions of the acquired image to create an all-in-focus image.

BRIEF DESCRIPTION OF THE DRAWINGS

The Detailed Description of the Invention, including the description of various embodiments of the invention, will be best understood when read in reference to the accompanying figures wherein:

FIG. 2a is a side view illustrating an operation of the device illustrated in FIG. 1a FIG. 2b is a side view illustrating another operation of the device illustrated in FIG. 1a;

FIG. 3 is a side view depicting a device having a multi-spectral spatial light modulator according to various embodiments of the present invention;

FIG. 4a is a side view depicting a device according to various embodiments of the present invention, the device including an array of lenses arrange on a slanted plane relative to an image detector;

FIG. 4b is a side view depicting a device according to various embodiments of the present invention, the device including an array of lenses having different curvature;

FIG. 7a is a side view depicting a device having two spatial light modulator layers according to various embodiments of the present invention;

FIG. 7b is a side view depicting another configuration of the device shown in FIG. 7a;

DETAILED DESCRIPTION OF THE INVENTION

Figure 1A:
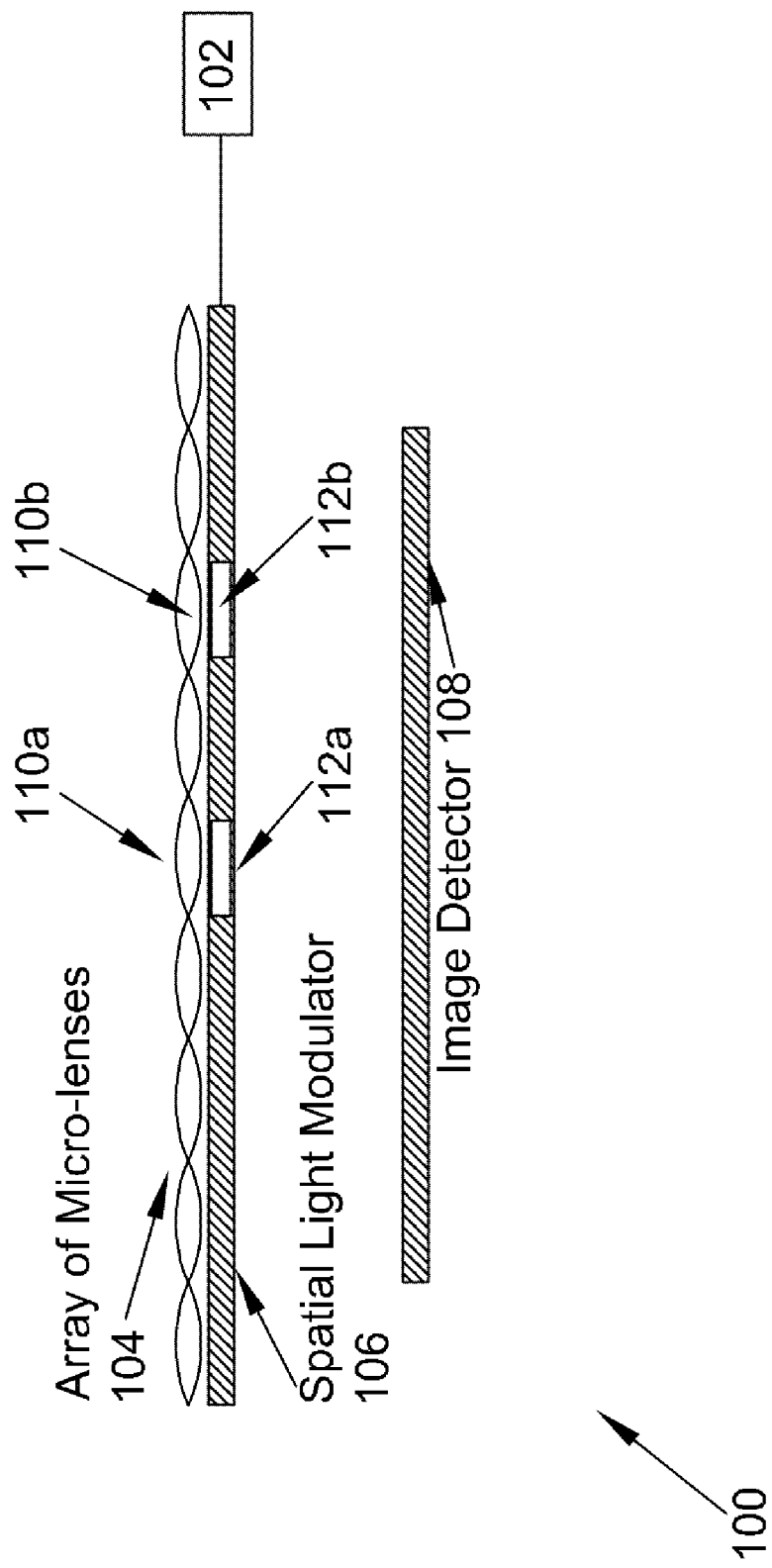
FIG. 1a is a side view depicting a device according to various embodiments of the present invention.

Embodiments of the present invention provide imaging devices whose imaging properties can be changed dramatically without physically moving the components of the imaging devices FIG. 1a is a side view of a device of various embodiments of the present invention, generally at 100. Device 100 includes an image detector 108 for acquiring images, a plurality of lenses 104, a spatial light modulator ("SLM") 106, and a controller 102 coupled with light modulator 106. Light modulator 106 can be a liquid crystal display ("LCD") including a liquid crystal sheet. Alternatively, light modulator 106 can be a digital micromirror device ("DMD"), or a liquid crystal on silicon ("LCOS") device. Light modulator 106 has a plurality of elements where each of the elements has a transmittance that can be dynamically controlled by controller 102 independent of other elements. The transmittance of the elements can have at least one translucent state and at least one opaque state controllable by controller 102.

Figure 1B:
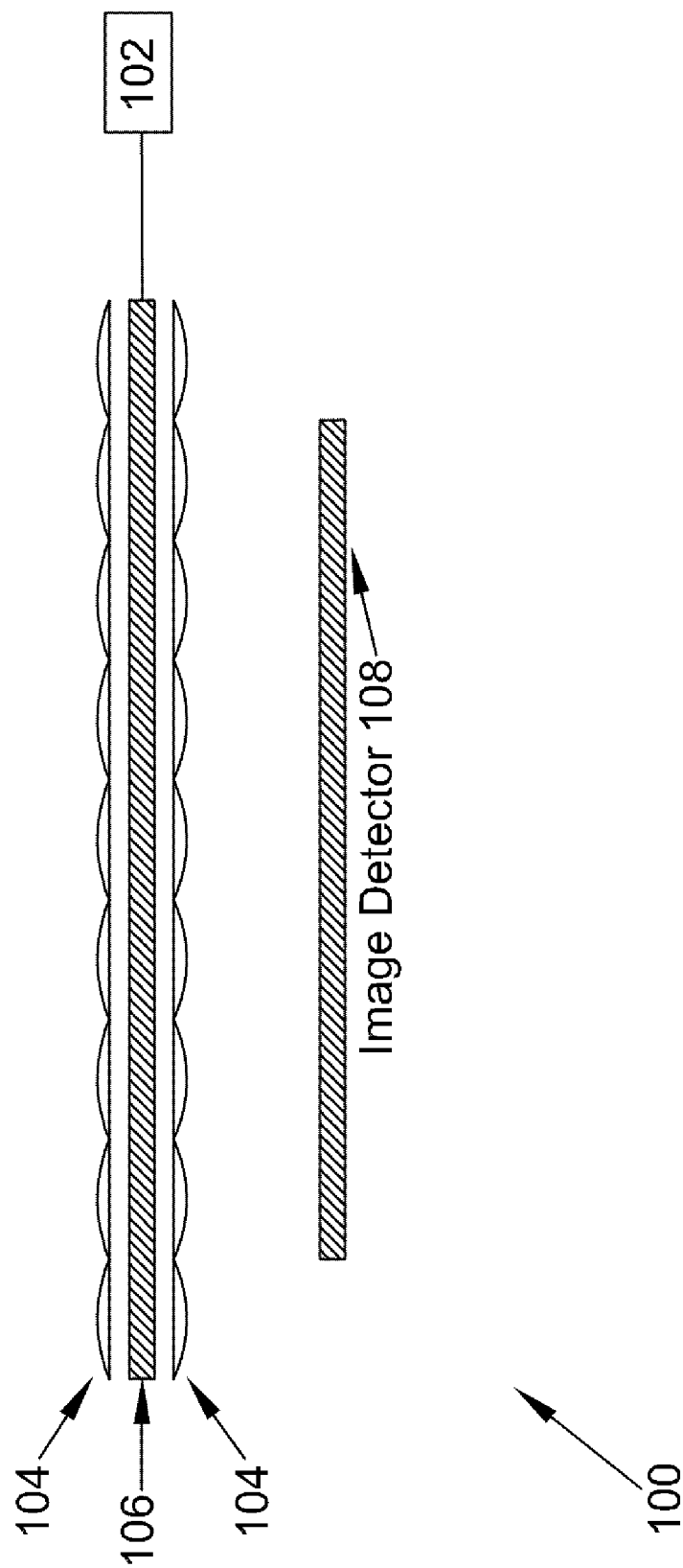
FIG. 1b is a side view depicting a device incorporating a light modulator placed in side lenses according to various embodiments of the present invention.

Lenses 104 can be an array of micro-lenses, or any other types of lenses suitably sized to operate in conjunction with light modulator 106. A lens among lenses 104 may have a size equal to the size of a corresponding element of light modulator 106; however, the lens may also be larger or smaller than an element of light modulator 106. Lenses 104 can be arranged so that each of the lenses 104 receives light independently of (or, without interference from) each other. For example, lenses 104 can be arranged on a planar grid, on a line, and/or on a curved sheet. In one embodiment, lenses 104 forms a layer that is substantially parallel to light modulator 106. Light modulator 106 can be operatively joined with the array of lenses 104. In some embodiments, light modulator 106 is attached to or placed next ) the array of lenses 104. In other embodiments, as shown in FIG. 1b, light modulator 106 is placed inside the lenses 104, as described in El. Farid and F. P. Simoncelli. Range Estimation by Optical Differentiation, *Journal of the Optical Society of America*, 15(7): 1777-1786, July 1998, which is hereby incorporated by reference. fly controlling light modulator 106 using controller 102, light entering some of the lenses 104 can be blocked, while light that enters other lenses can pass through light modulator 106. If light that enters a lens can pass through light modulator 106, the lens is referred to as being opened; otherwise, the lens is referred to as being blocked.

For example, controller 102 can form apertures 112a, 112b on light modulator 106, wherein an aperture refers to a region that includes one or more elements of light modulator 106 having a higher transmittance than elements surrounding the region. Apertures 112a, 112b can be collocated with lenses 110a, 110b respectively, so that light that enters lenses 111a, 110b passes through light modulator 106 while light that enters other lenses are blocked. Hence, in this example, controller 102 controls light modulator 106 to open lenses 110a and 110b.

By controlling light modulator 106 electronically, device 100 can acquire images with changing viewing directions (or fields of view), as illustrated in FIGS. 2a and 2b. At one time instance, shown in FIG. 2a, all lenses are blocked except lens 202a. Then, at the next time instance, shown in FIG. 2b, lens 202a is blocked, and a different lens 202b is opened by forming an aperture 204b on light modulator 106. Because lens 202a, 202b corresponds to different viewing directions, device 100 can change its viewing direction instantaneously and dramatically without physically moving its components.

FIG. 3 is a side view of an imaging device 300 of various embodiments of the present invention, which can be used to capture a multi-spectral image. Similar to device 100, device 300 includes image detector 108 operatively joined with lenses 104. Device 300 also includes a multi-spectral spatial light modulator 302, which can be electronically tuned to filter light of desired spectral wavelengths. Therefore, light modulator 302 also serves as a controllable spectral filter. Light modulator 302 can be a liquid-crystal tunable filter ("LCTF").

By electronically controlling light modulator 302, device 300 can acquire a series of images, each with a different tunable filter setting. The series of images can then be combined together to form a multi-spectral image. The use of tunable filters for multi-spectral imaging is generally described in N. Gat, Imaging Spectroscopy Using Tunable filters: A Review, *Proc. SPIE Conf Algorithms for Multispectral and Hyperspectral Imagery VI*, April 2000, and S. Poger and E. Angelopoulou, Selecting Components for Building Multispectral Sensors, *IEEE CVPR Technical Sketches*, December 2001, which are hereby incorporated by reference. Device 300 can be used to acquire multi-spectral images in combination with other functionalities. For example, device 300 can acquire multi-spectral images at arbitrary viewing directions without physically moving its components.

FIG. 4a is a side view of an imaging device 400 of various embodiments of the present invention, which can be used to acquire all-in-focus images. Different from device 100, lenses 404 and light modulator 406 of device 400 are placed on a slanted plane relative to image detector 408. Alternatively, lenses 404 and light modulator 406 can be placed on a curved sheet. Hence, lenses 404 are associated with different planes of focus. To acquire an all-in-focus image, a series of images can be acquired at different time instances by opening a different lens at each time instance. To open a lens, an aperture collocated with the lens can be formed on light modulator 406 so that light that enters the lens can pass through light modulator 406.

The acquired images, which overlap in a common area, can then be warped and combined in the common area to form an all-in-focus image. Warping, which includes alignment of the images, can be performed with any image registration algorithm, for example as described in J. R. Bergen, P. Anandan, K. J. Hanna, and R. Hingorani, Hierarchical Model-based Motion Estimation, *European Conf. on Computer Vision*, pages 237-252, 1992, which is hereby incorporated by reference. An algorithm to combine images captured at different focus settings can be found in E. H. Adelson, C. H. Anderson, J. R. Bergen, P. J. Burt, and Ogden J. M., Pyramid Method in Image Processing. *RCA Engineer*, 29(6):33-41, 1984, which is hereby incorporated by reference.

FIG. 4b is a side view of an imaging device 450 that can also be used to acquire all-in-focus images. In device 450, lenses 454 have different curvatures and are therefore associated with different planes of focus. Similar to device 400, device 450 can be used to acquire a series of images by opening different lenses 450 at different time instances. The series of images can then be warped and combined to form an all-in-focus image.

Figure 5:
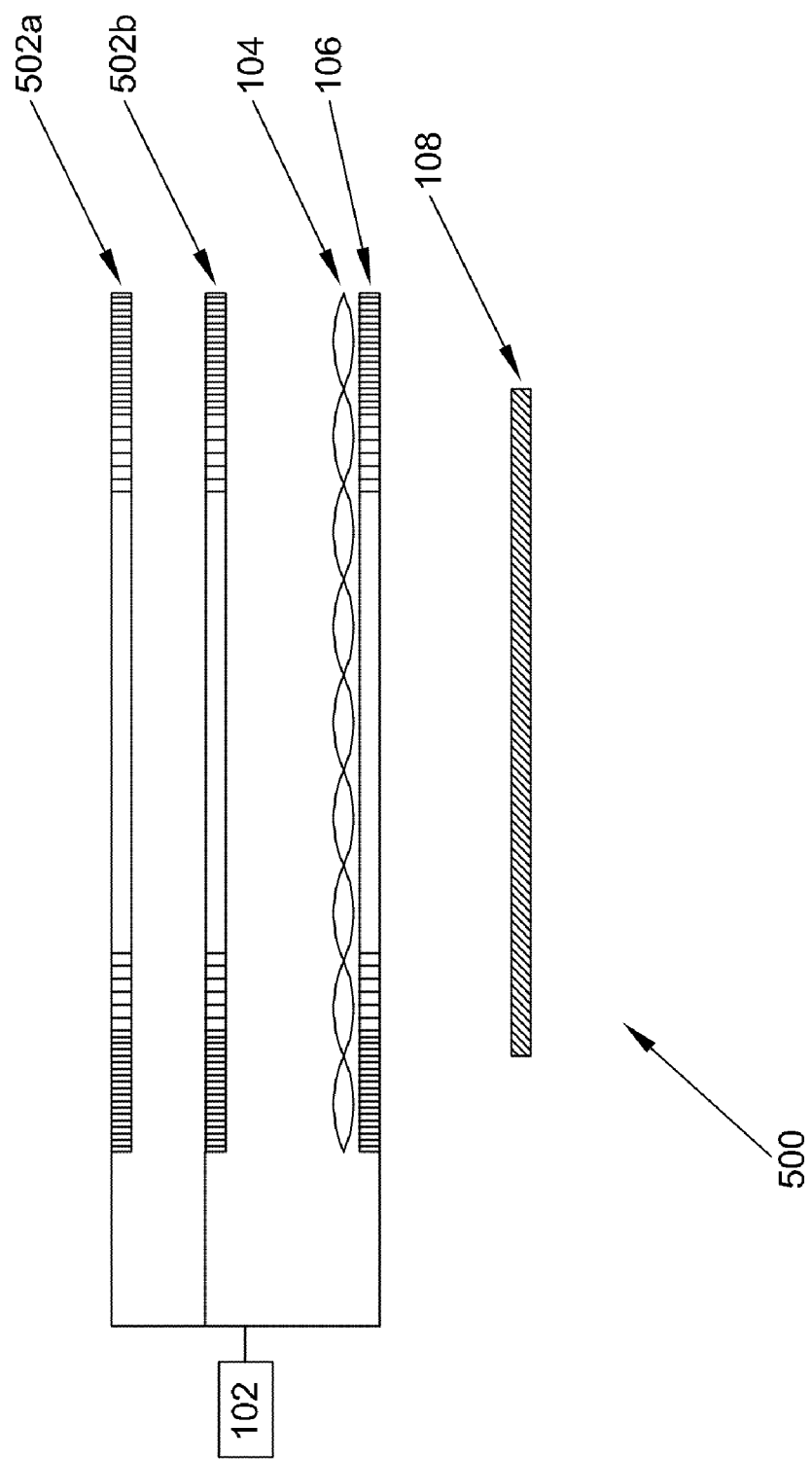
FIG. 5 is a side view depicting a device having three spatial light modulator layers according to various embodiments of the present invention.

FIG. 5 is a side view of a device of various embodiments of the present invention, generally at 500. Device 500 is similar to device 100, having image detector 108, an array of lenses 104, spatial light modulator 106 operatively joined with lenses 104, and controller 102 configured to control light modulator 106. Different from device 100, device 500 has one or more additional layers of spatial light modulators, for example, 502a and 502b, also controlled by controller 102. By creating apertures on light modulators 106, 502a, and 502b, device 500 can be used to perform any functionality that can be performed by device 100. In addition, device 500 can be used in other applications, as described below.

Figure 6:
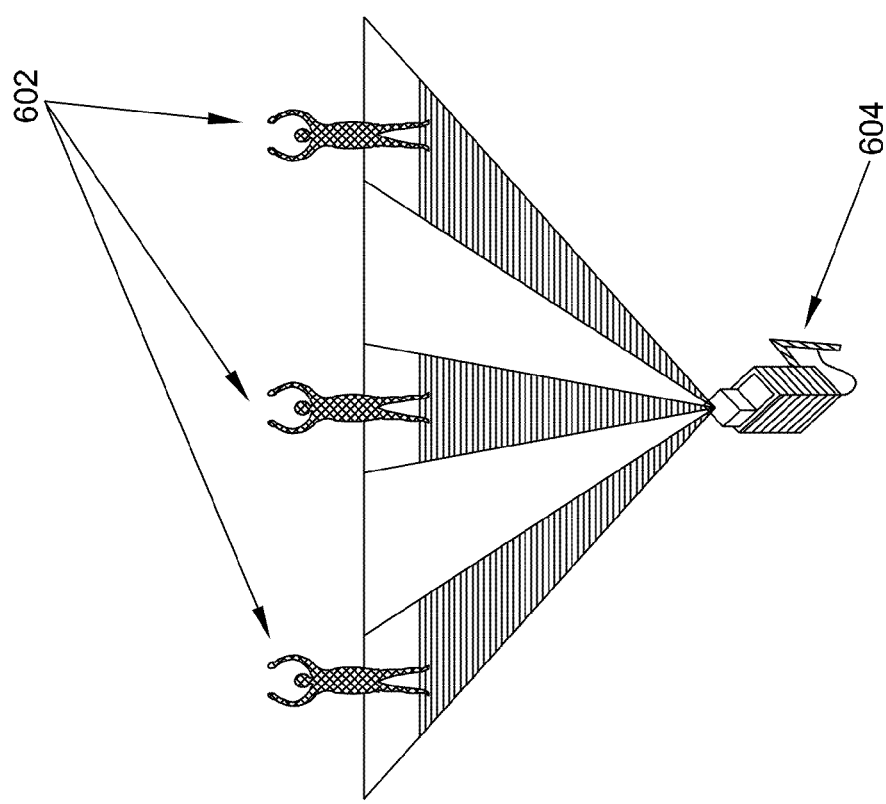
FIG. 6 is a diagram illustrating disjointed fields of view to be acquired by a device according to various embodiments of the present invention.

Device 500 can be used to acquire images with split or disjointed fields of view. In other words, device 500 can acquire images containing only selected parts of a scene without acquiring the regions in between the selected parts. FIG. 6 illustrates a scene with multiple objects of interest 602 that are far apart. To capture all of these objects 602 with a conventional camera (not shown), the camera must maintain a wide field of view and therefore can only acquire an image containing objects 602 with low resolution. In contrast, with an imaging device 600 of the present invention, an image containing only three slices of the field of view shown in FIG. 6 can be acquired. Therefore, an imaged of all of objects 602 can be simultaneously acquired at higher resolution.

Figures 7A, 7B:
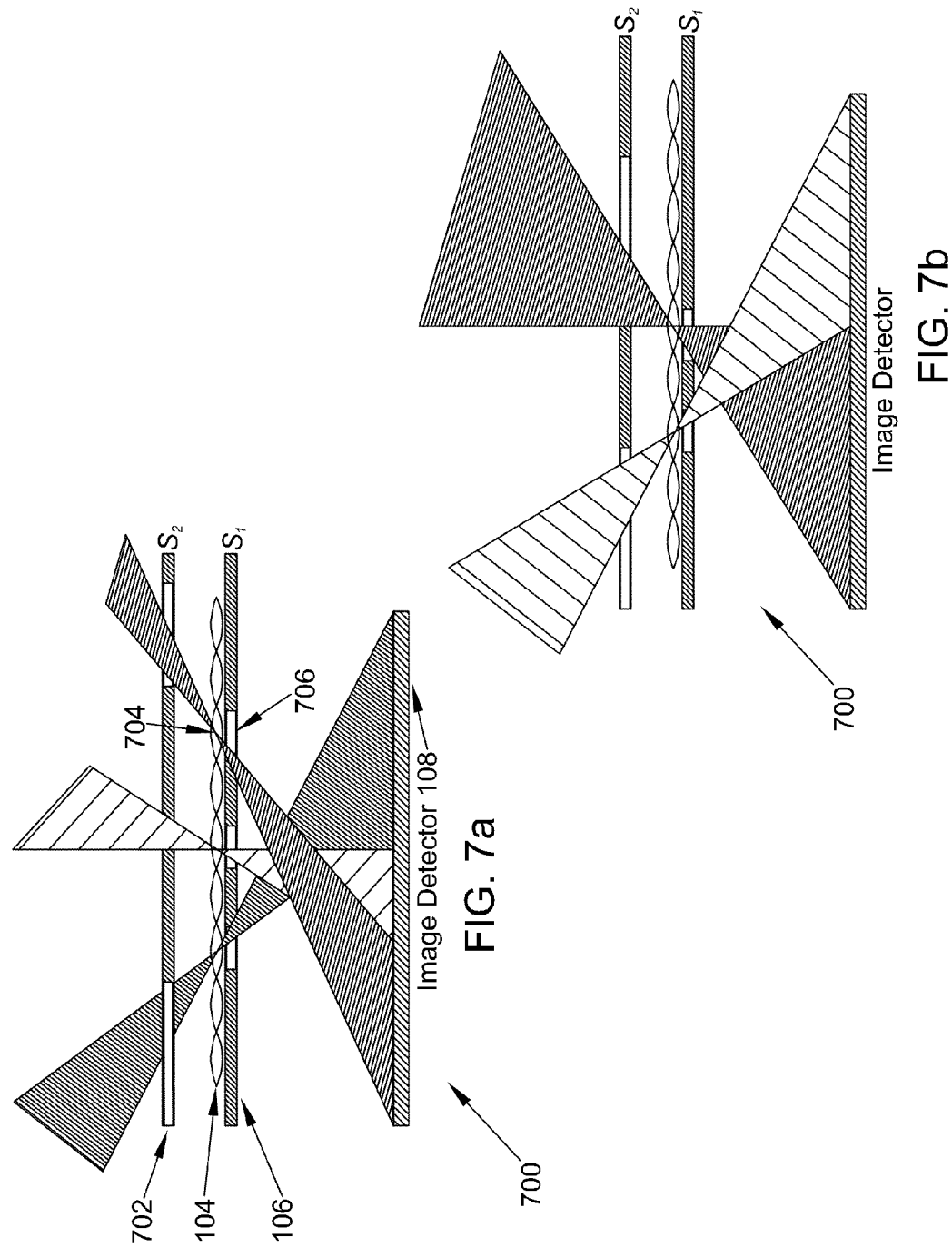

FIG. 7a is a side view of a device 700 of various embodiments of the present invention that can be used to acquire images with disjointed fields of view as illustrated in FIG. 6. In addition to light modulator 106 operatively joined with array of lenses 104, device 700 includes light modulator 702 disposed at a distance from lenses 104. Light modulator 106 opens a small set of lenses (e.g., lens 704) by creating corresponding apertures (e.g., aperture 706) collocated with the lenses, and blocks all the other lenses. Light modulator 702 blocks parts of the field of view so that each point in an acquired image is exposed only to light coming from one of the opened lenses (e.g., lens 704). FIG. 7*b* is a side view of device 700 of various embodiments of the present invention, which can be used to acquire an image containing two disjointed fields of view.

In device 700, a controller (not shown) can determine at each time distance which parts of the scene to acquire in an image, and create apertures on light modulators 106 and 702 accordingly. In addition, device 700 can dynamically change its imaging properties to account for motion of objects of interest in the scene and/or to account for a change in the number of objects of interest.

Figure 8:
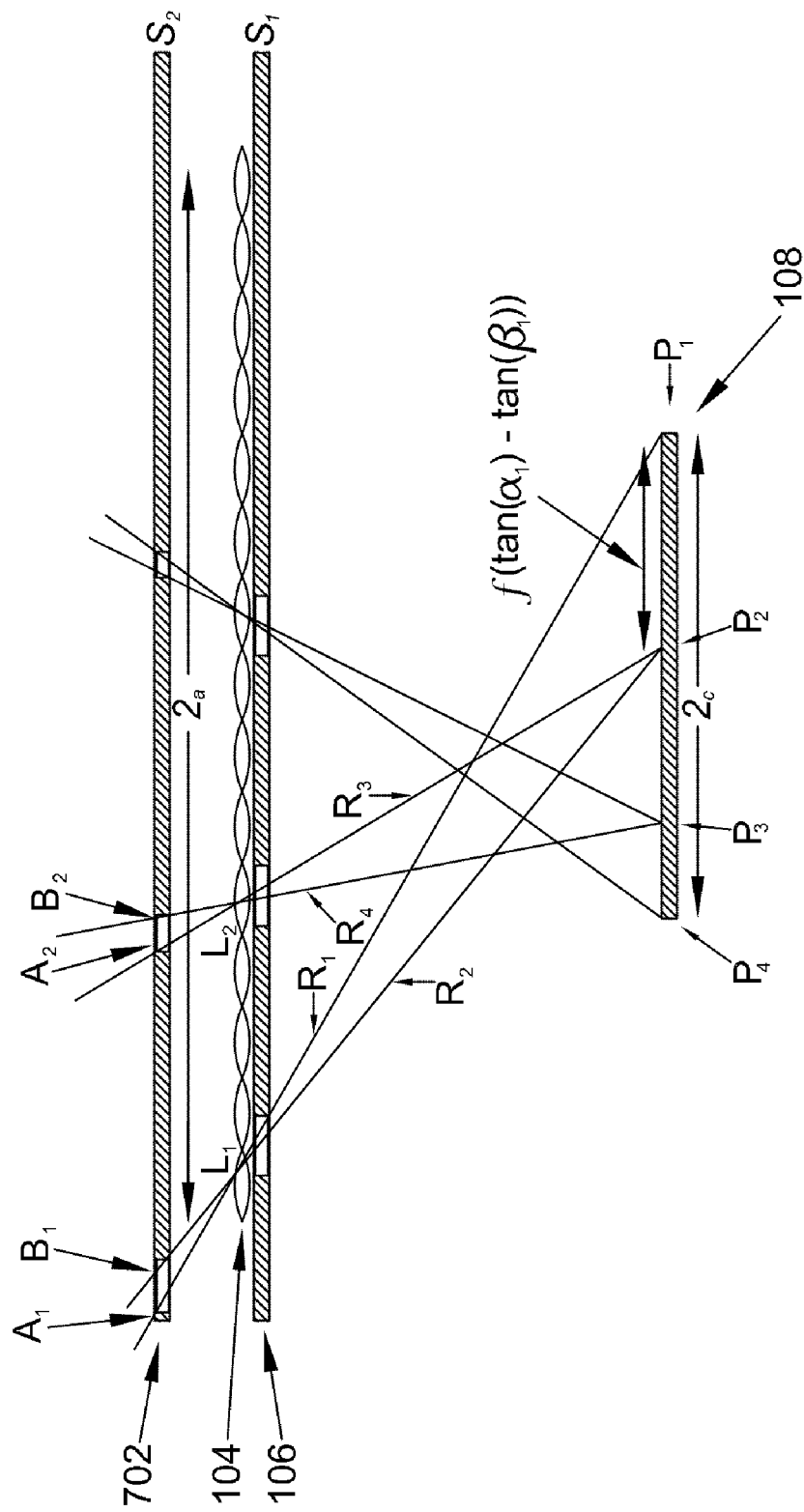
FIG. 8 is diagram used for deriving a formula described in the present invention.

FIG. 8 is a diagram depicting device 700 and explaining how the transmittance pattern of light modulators 106, 702 of device 700 can be determined to acquire images containing disjointed fields of view. Assume that the scene is far, so that each point in the scene can be assigned an approximate orientation with respect to the image detector 108. Assume there are m objects of interest in the scene. Object j occupies horizontal angular range $(\alpha_j, \beta_j)$, with $\alpha_j > \beta_{j-1}$. Let f be the distance between image detector 108 and lens array 104, and let c be half the width of image detector 108. The angular range that is captured with a conventional camera with focal length f is $|\tan(\theta)| < c/f$. With device 700, assume that lenses 104 are arranged in a dense grid of width $2a$ that is parallel to image detector 108 and whose center is in front of the center of image detector 108. The angular range that $$\sum_{j=1}^{m} |\beta_j - \alpha_j| \leq 2\mathrm{atan}\left(\frac{c}{f}\right)$$

can be captured with device 700 is given by $|\tan(\theta)| < (a+c)/f$. Assume that the objects of interest are within this range. The set of objects can fit in the image only if:

In FIG. 8, ray $R_1$ is defined by the right hand boundary of the detector $P_1$ and angle $\alpha_1$. Assume that array of lenses 104 is dense, so that $R_1$ passes through a center of a lens $L_1$. Otherwise, an angle smaller than $\alpha_1$ needs to be used. Ray $R_2$ is defined by the lens center $L_1$ and angle $\beta_1$. In light modulator 106, an aperture collocated with lens $L_1$ is opened. In light modulator 702, the aperture can be determined by simple geometry: Let $f_2$ be the distance of light modulator 702. Points on the image detector 108 are represented by their offset with respect to the center of the image detector. The right hand side boundary point $P_1$ is located at offset c. The lens center $L_1$ is at offset $c+f*\tan(\alpha_1)$. Therefore, on light modulator 702, all points between $c+f_2*\tan(\alpha_1)$ and $c+f*\tan(\alpha_1)+(f_2-f)*\tan(\beta_1)$ shall be turned to a translucent state. The next ranges can be determined similarly. For the jth object, the right hand side boundary point is located on:

$$d = c - \sum_{k=1}^{j-1} f(\tan(\beta_k) - \tan(\alpha_k))$$

$R_{2j-1}$ is determined by the right hand side boundary point $P_j$ and $\alpha_j$. The relevant lens $L_j$ is determined by the intersection of the lens array 104 with $R_{2j-1}$. $R_{2j}$ is determined by the corresponding open lenses $L_j$ and $\beta_j$. Therefore, on light modulator 702, points between $d+f_2*\tan(\alpha_j)$ and $d+f*\tan(\alpha_j)+(f_2-f)*\tan(\beta_j)$ shall be turned to a translucent state.

FIG. 8 can also help in deriving the criteria that assure that all image points collect light coming from a single lens. Consider, for example, the first lens $L_1$. In order to make sure that no light pass through this lens to reach irrelevant parts of the image, segment $B_1A_2$ has to block all light through $L_1$ to the segment $P_2P_4$ on image detector 108. This translates to the constraint $f*(A_2-B_1)/(f_2-f) \geq P_2-P_4$, which is equivalent to $f*f_1*(\tan(\alpha_2)-\tan(\beta_1))/(f_2-f) \geq 2c-f*(\tan(\beta_1)-\tan(\alpha_1))$. In general, the following criteria should be satisfied for every j:

$$f \frac{f_2(\tan(\alpha_{j+1}) - \tan(\beta_j))}{f_2 - f} \geq 2c - \sum_{k=1}^{j} f(\tan(\beta_k) - \tan(\alpha_k))$$

$$f \frac{f_2(\tan(\alpha_{j+1}) - \tan(\beta_j))}{f_2 - f} \geq \sum_{k=1}^{j-1} f(\tan(\beta_k) - \tan(\alpha_k))$$

Therefore, one way to ensure that these criteria are satisfied is by placing light modulator 702 close to lens array 104 so that $f_2-f$ is small.

Figure 9:
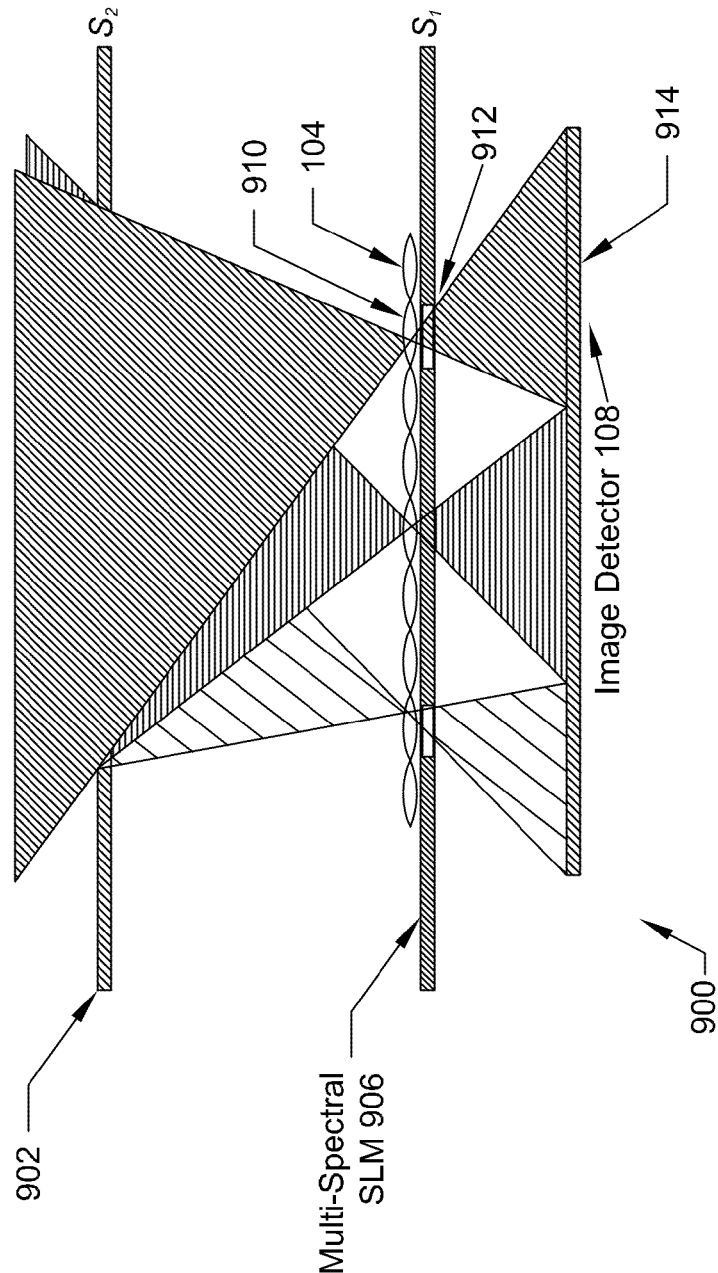
FIG. 9 is a side view depicting a device having a multi-spectral spatial light modulator, according to various embodiments of the present invention.

Devices of various embodiments of the present invention can also be used to simultaneously acquire multiple images that are associated with overlapping fields of view. As illustrated in FIG. 9, using a multi-spectral spatial light modulator, a device of various embodiments of the present invention, generally at 900, can be used to simultaneously acquire multiple images corresponding to different spectral components of a scene. In device 900, multi-spectral spatial light modulator 906 that is coupled with lens array 104 opens a plurality of lenses (e.g., lens 910) by creating apertures (e.g., aperture 912) collocated with the plurality of lenses (e.g., lens 910), each with a different spectral response. A second spatial light modulator 902 can be used to block light, such that image detector 108 is subdivided to regions (e.g., region 914 corresponding to lens 910), where each region receives only light coming from one of the lenses (e.g., lens 910), and all regions are associated with overlapping fields of view.

After acquiring images using different regions (e.g., region 914) of image detector 108, the images can be warped and combined to form a multi-spectral image, which can be a video frame. This multi-spectral image has fewer pixels than the acquired images, but each pixel includes multiple spectral channels. The alignment between the regions can be performed offline during the calibration of the imaging device using any multi-sensor alignment method. Methods of alignment are described in M. Irani and P. Anandan, Robust Multi-sensor Image Alignment, *Int. Conf. on Computer-Vision*, pages 959-966, January 1998, and P. A. Viola and W. M. Wells, III., Alignment by Maximization of Mutual Information. *Int. J. of Computer Vision,* 24(2): 137-154, September 1997, which are hereby incorporated by reference. Device 900 can be configured to acquire video frames at different time instances, and therefore, a multi-spectral video can be created by combining the video frames.

Figure 10:
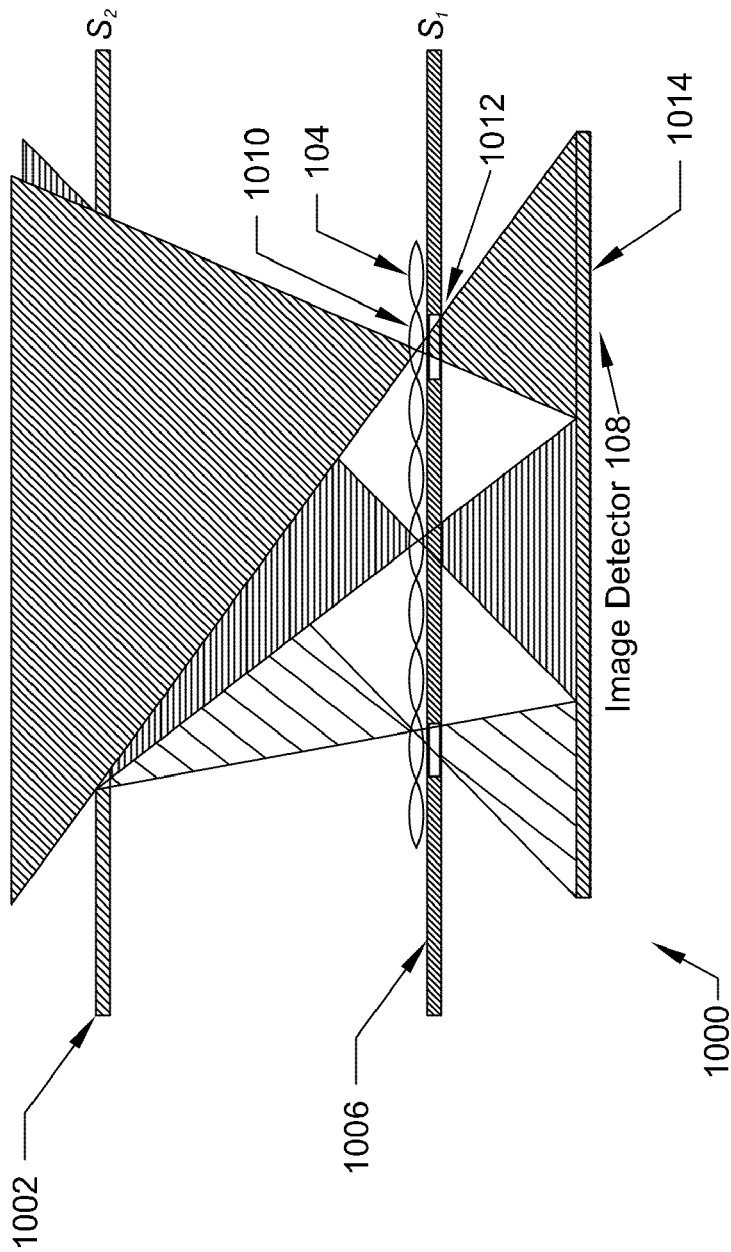
FIG. 10 is a side view depicting another device for high dynamic range imaging according to various embodiments of the present invention.

FIG. 10 is a side view depicting a device of various embodiments of the present invention, generally at 1000, that can be used to acquire high dynamic range images including video images. Similar to device 900, device 1000 can be configured to simultaneously acquire multiple images that are associated with overlapping fields of view using different regions of image detector 108. Rather than using spectral filters as in device 900, device 1000 associates different attenuation to different lenses by creating apertures of different transmittance on spatial light modulator 1006. A second spatial light modulator 1002 can be used to block light such that image detector 108 is subdivided to regions where each region receives only light coming from one of the opened lenses and all regions have overlapping fields of view. The acquired images that are associated with different attenuation can then be warped for alignment and combined to produce a high dynamic range image. The high dynamic range image has fewer pixels than the number of pixels in image detector 108, but has higher dynamic range. The alignment of the multiple images can be performed offline during the calibration of device 1000. Because under different attenuation the images may have substantial differences, a multi-sensor alignment technique can be used. Device 1000 can be configured to acquire video frames at different time instances, and therefore, a high dynamic range video can be created by combining the acquired video frames.

Figure 11:
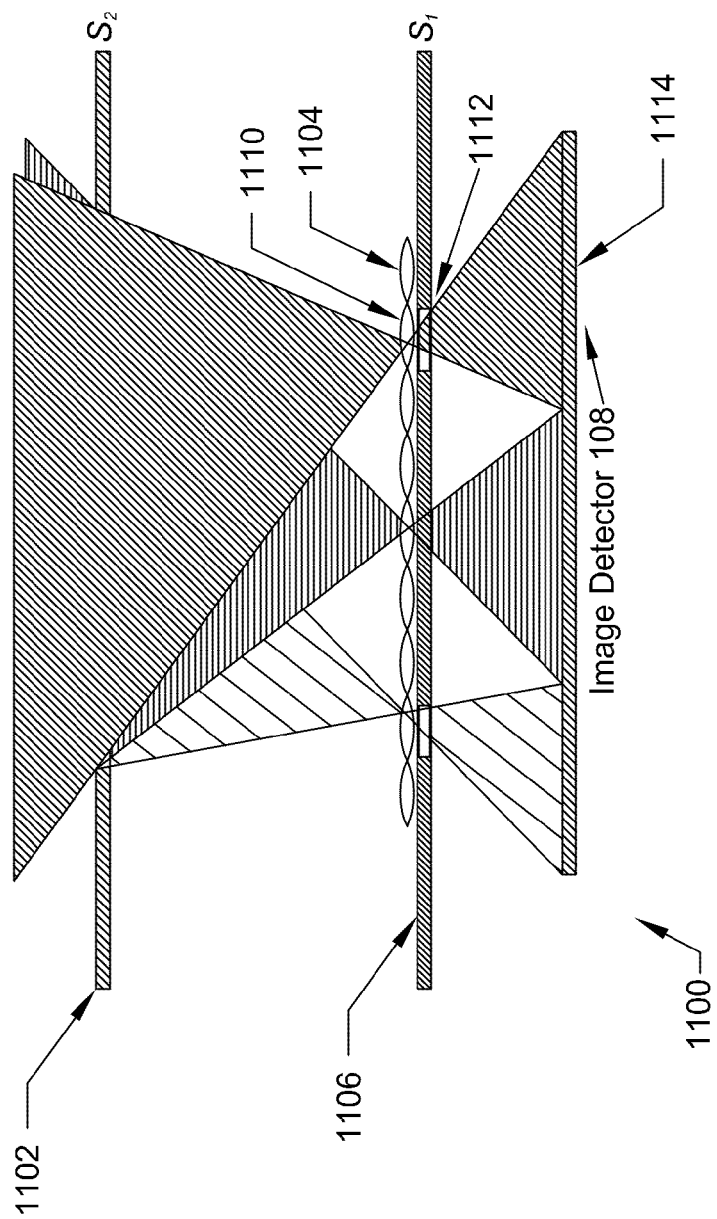
FIG. 11 is a side view depicting another device according to various embodiments of the present invention, the device having an array of lenses having different curvature.

FIG. 11 is a side view depicting a device of various embodiments of the present invention, generally at 1100, that can be used to acquire all-in-focus images. Similar to device 900, device 1100 can be configured to simultaneously acquire multiple images that are associated with overlapping fields of view using different regions of image detector 108. In device 1100, lenses 1104 have different curvature and are therefore associated with different planes of focus. Therefore, device 1100 can simultaneously acquire images corresponding to different focal components of a scene using different portions of image detector 108. Lenses 1104 that are associated with different planes of focus can be opened using light modulator 1106. Light modulator 1102 can be used to block light to ensure that each point on image detector 108 collects only light coming from one of the lenses. A plurality of images acquired using different regions of image detector 108 can then be warped and combined to produce an all-in-focus image. The produced all-in-focus image has fewer pixels than the number of pixels in the detector, but all pixels are in focus. A series of all-in-focus images can be acquired at different time instances and combined to form a video.

Rather than using lenses 1104 having different curvature, an all-in-focus imaging device can also use lenses and a light modulator that are placed on a slanted plane relative to the image detector 108, as illustrated in FIG. 4a. Alternatively, the lenses and the light modulator can be placed on a curved sheet. In these cases, the lenses are also associated with different planes of focus.

Figure 12:
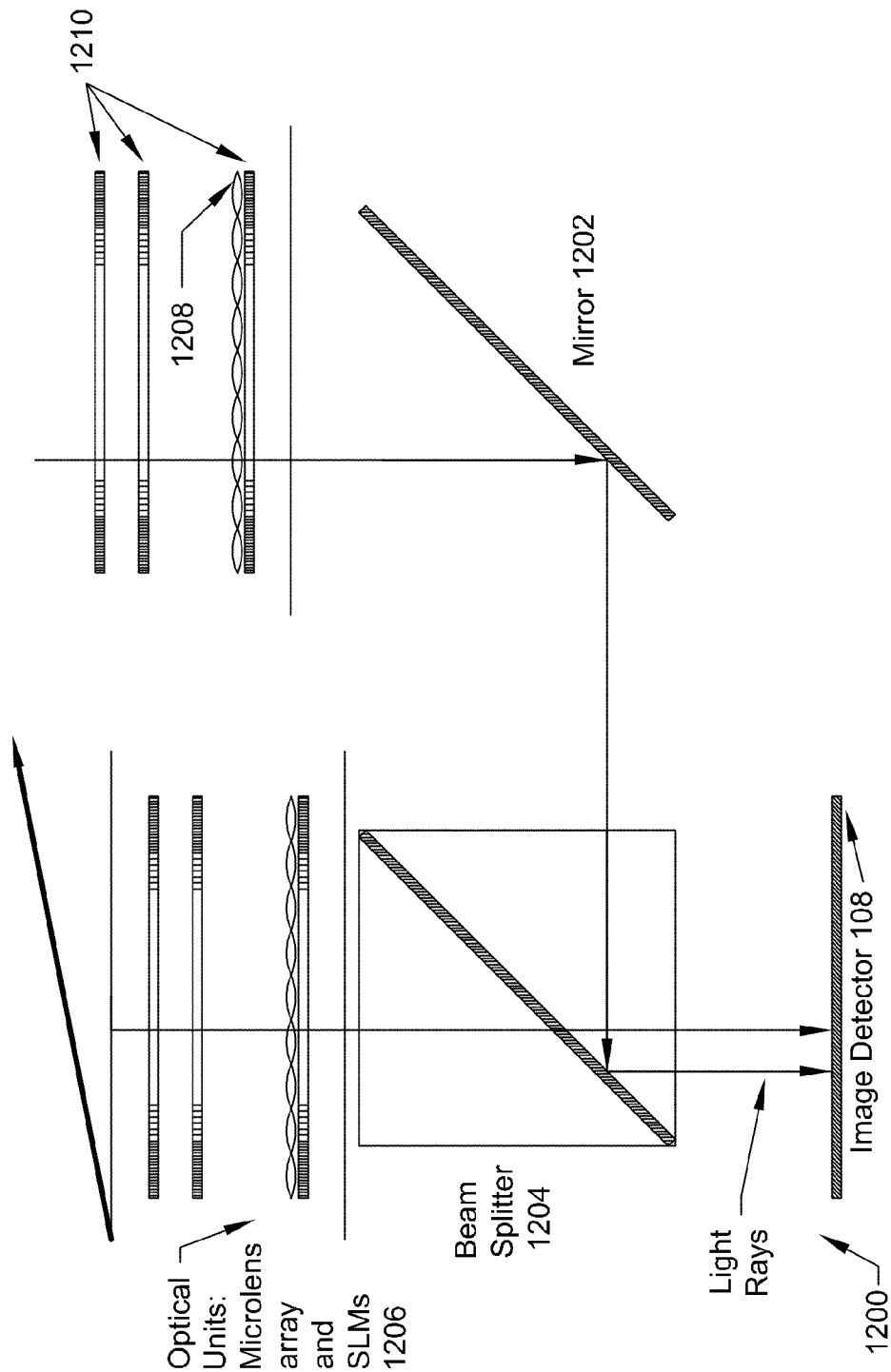
FIG. 12 is a side view depicting a device having two optical units according to various embodiments of the present invention.

FIG. 12 is a side view of a device of various embodiments of the present invention, generally at 1200. Device 1200 includes image detector 108, beam splitter 1204, mirror 1202, and multiple optical units 1206. Each optical unit is similar to the optics of imaging device 500 illustrated in FIG. 5, including multiple spatial light modulators (e.g., light modulators 1210) and an array of lenses (e.g., lenses 1208). Using device 1200, image parts from the multiple optical units 1206 can be optically combined into one acquired image. In particular, device 1200 can be used to acquire images of different objects with different zoom magnifications. For example, one of the optical units 1206 can acquire an image of one object (not shown) with a certain zoom magnification, while the other optical unit can acquire an image of another object (not shown) with a different zoom magnification. The two acquired images can be optically combined using mirror 1202 and beam splitter 1204. Device 1200 can also acquire images containing a wide view of a scene while particular scene parts are acquired with higher magnification. This functionality is referred to as spatially-varying zoom because different parts in the image are associated with different zoom magnifications.

Figure 13:
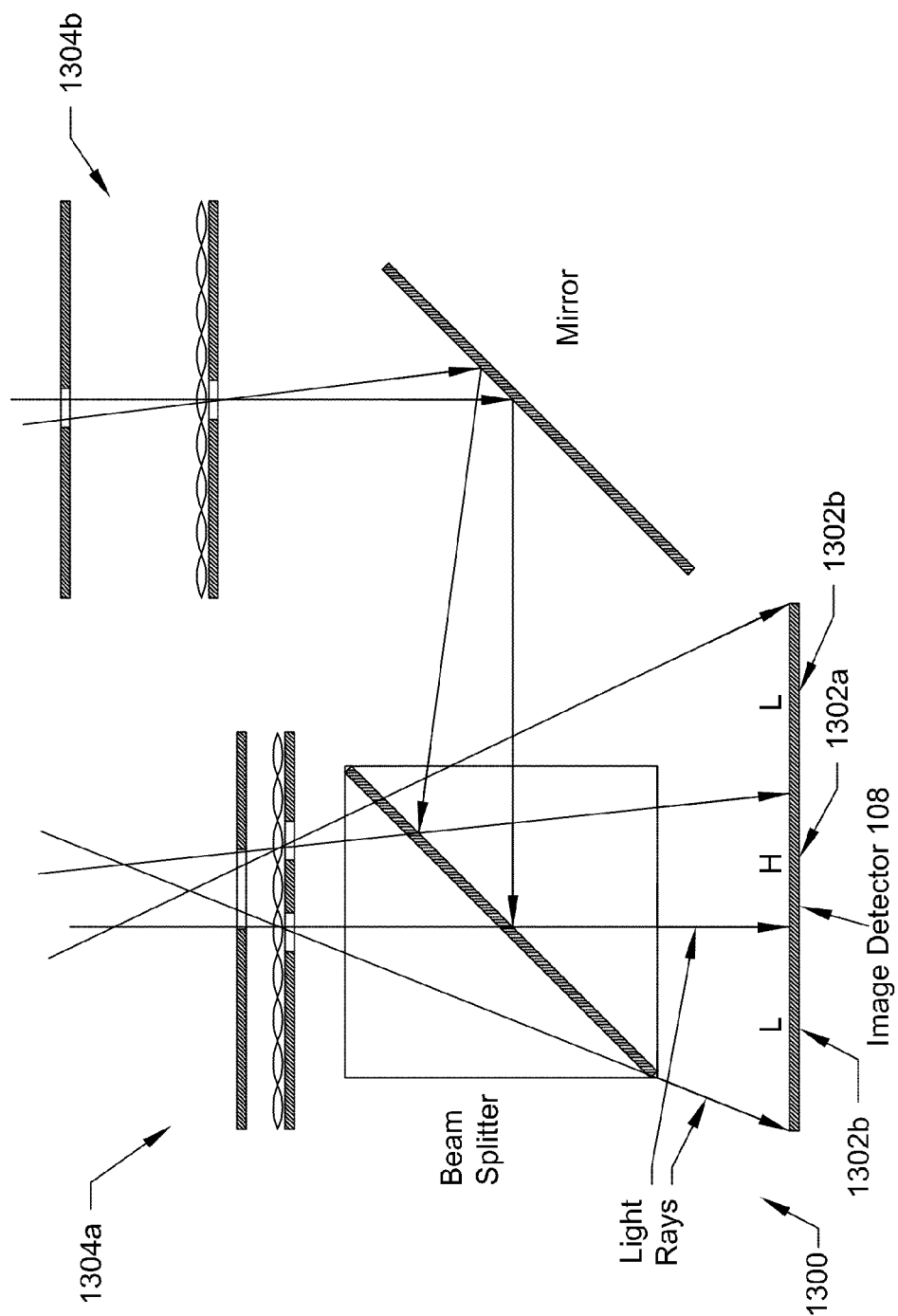
FIG. 13 is a side view depicting another device having two optical units according to various embodiments of the present invention.

FIG. 13 illustrates a device implementing the spatially varying zoom functionality, generally at 1300. Device 1300 includes optical units 1304a, 1304b, where optical unit 1304a is associated with a lower zoom magnification than optical unit 1304b. By controlling light modulators in optical unit 1304a, images containing a scene can be acquired using regions 1302b of image detector 108. Similarly, by controlling light modulators in optical unit 1304b, an image containing an object (not shown) in the scene can be acquired using region 1302a of image detector 108. Light modulators in optical units 1304a, 1304b can be programmed such that each point on image detector 108 collects light coming only from one of the lenses in one of the lens arrays. Therefore, device 1300 can be used to acquire an image containing a continuous field of view, so that one scene part is acquired in one region 1302a of image detector 108 with a higher zoom magnification than other scene parts acquired in other regions 1302b of image detector 108. Similarly, device 1300 can be used to acquire an image with split or disjointed fields of view so that selected scene parts are acquired with different zoom magnifications.

Although different functionalities are disclosed herein using different designs of an imaging device, it is noted that various combinations of functionalities can be implemented in one imaging device. For example, although a device that can acquire images containing disjointed fields of view and a device that can acquire multi-spectral images are described separately in connection with FIG. 7a and FIG. 9, a single imaging device with three or more spatial light modulators can implement both functionalities. Similarly, a device with multiple lens arrays, such as device 1200 described in connection with FIG. 12, can implement multiple functionalities, such as all-in-focus imaging and disjointed fields of view imaging. In addition, although some devices disclosed herein use planar image detectors, light modulators and lens arrays that are parallel to each other, devices with any of these components being curved or non-parallel to each other can be used.

Other embodiments, extensions, and modifications of the ideas presented above are comprehended and within the reach of one skilled in the art upon reviewing the present disclosure. Accordingly, the scope of the present invention in its various aspects should not be limited by the examples and embodiments presented above. The individual aspects of the present invention, and the entirety of the invention should be regarded so as to allow for modifications and future developments within the scope of the present disclosure. The present invention is limited only by the claims that follow.

What is claimed is:

1. An optical device for acquiring at least one image, the device comprising:
a first light modulator layer having a plurality of elements, each having a transmittance, wherein the transmittance of each of the plurality of elements is controllable;
a plurality of lenses, wherein each of the plurality of lenses is disposed to receive light independently of each other and wherein each of the plurality of lenses corresponds to a unique subset of the plurality of elements of the first light modulator layer;
an image detector configured to acquire at least one image from light that passes through at least one of the plurality of lenses and the first light modulator layer; and
a controller configured to control transmittance of the plurality of elements of the first light modulator layer, wherein the controller is further configured to created at least one first aperture within the first light modulator layer, the at least one first aperture comprising at least one element of the first light modulator layer having a higher transmittance than elements surrounding the at least one first aperture, wherein the at least one first aperture is collocated with at least one first lens among the plurality of lenses, allowing light that enters the at least one first lens to pass through the first light modulator layer, and wherein the controller is further configured to change the location of the at least one first aperture an collocate the at least one first aperture with at least one second lens among the plurality of lenses.

2. The device of claim 1, wherein the plurality of lenses are arranged on a second parallel to the first light modulator layer.

3. The device of claim 1, wherein the first light modulator layer comprises a liquid crystal sheet.

4. The device of claim 1, wherein the first hg it modulator layer comprises a liquid crystal on silicon device.

5. The device of claim 1. wherein the plurality of lenses are arranged on a planar grid.

6. The device of claim 1, wherein the plurality of lenses are arranged on a line.

7. The device of claim 1, wherein transmittance of each of the plurality of elements of the first light modulator layer is controllable between at least one state that is translucent and at least one state that is opaque.

8. The device of claim 1, wherein the first tight modulator layer is disposed within the plurality of lenses.

9. The device of claim 1, wherein the first light modulator layer comprises at least one multi spectral spatial light modulator.

10. The device of claim 9, wherein the at least one multi-spectral spatial light modulator comprises a liquid-crystal tunable filter.

11. The device of claim 1, wherein the plurality of lenses are associated with a plurality of focal planes.

12. The device of claim 11, wherein the plurality of lenses are arranged on a plane that is slanted with respect to the image detector.

13. The device of claim 11, wherein the plurality of lenses are arranged on a curved sheet.

14. The device of claim 11, wherein the plurality of lenses are associated with a plurality of focal lengths.

15. The device of claim 1, wherein the image detector is disposed at a first distance from the first light modulating layer, further comprising:
at least one additional light modulator layer disposed at a second distance from the first light modulator layer,
wherein the controller is further configured to create at least one aperture on the at least one additional light modulator layer.

16. The device of claim 15, wherein the first light modulator layer and the at least one additional light modulator layer form a plurality of disjointed fields of view.

17. The device of claim 15,
wherein the first light modulator layer comprises a plurality of multi-spectral spatial light modulators; and
wherein the controller is further configured to create at least one addition aperture on the first light modulator layer, and control the plurality of multi-spectral spatial light modulators to associate different spectral responses with the at least one first aperture and the at least one addition aperture on the first light modulator layer.

18. The device of claim 15,
wherein the controller is further configured to create at least one addition aperture on the first light modulator layer, and associate different attenuation with the at least one first aperture and the at least one addition aperture on the first light modulator layer.

19. The device of claim 15,
wherein the plurality of lenses are associated with a plurality of focal planes; and wherein the controller is further configured to create at least one additional aperture on the first light modulator layer, and simultaneously form a plurality of images corresponding to the plurality of focal planes on a plurality of regions of the image detector.

20. The device of claim 1, wherein the device is further configured to acquire at a plurality of time instances a plurality of images and combine the plurality of images to form a video.

21. The device of claim 1, further comprising:
a plurality of additional lenses;
an additional light modulator layer coupled with the additional lenses, the additional light modulator layer having a plurality of elements, each having a transmittance, wherein the transmittance of each of the plurality of elements is controllable;
a mirror configured to redirect light that passes through the additional light modulator layer; and
a beam splitter configured to combine light from the mirror and light from the first light modulator layer to form at least one image on the image detector.

22. A method for acquiring at least one image using a first light modulator layer comprising a plurality of elements each having a controllable transmittance, a plurality of lenses, wherein each of the plurality of lenses is disposed to receive light independently of each other, and wherein each of the plurality of lenses corresponds to a unique subset of plurality of elements of the first light modulator layer, and in image detector, the method comprising:
controlling transmittance of the plurality of elements of the first light modulator layer to create at least one first aperture collocated with the at least one first lens among the plurality of lenses, the at least one first aperture comprising at least one element of the first light modulator layer having a higher transmittance than elements surrounding the at least one first aperture;
changing the location of the at least first aperture; collocating the at least one first aperture with at least one second lens among the plurality of lenses; and
acquiring at least one image using the image detector with light that passes through the at least one first lens.

23. The method of claim 22, further comprising:
controlling the first light modulator layer to create at least one additional aperture collocated with at least one additional lens among the plurality of lenses;
controlling a second light modulator layer disposed at a distance from the first light modulator layer to form a plurality of disjointed fields of view corresponding to the at least one first lens and the at least one additional lens; and
acquiring at least one image containing the plurality of disjointed fields of view using the image detector.

24. The method of claim 22, further comprising:
controlling the first light modulator layer to create at least one additional aperture collocated with the at least one additional lens;
controlling a second light modulator layer disposed at a distance from the first light modulator layer to create an aperture on the second light modulator layer, such that each of a plurality of regions of the image detector receives only light that passes through one lens among the plurality of lens, wherein the plurality of regions are associated with overlapping fields of view; and acquiring an image having a plurality of regions associated with overlapping fields of view using the image detector.

25. The method of claim 24, further comprising:

controlling the plurality of elements of the first light modulator layer to associate the at least one first aperture and the at least one additional aperture on the first light modulator layer with different filter settings, and combining the plurality of regions of the acquired image to create a multi-spectral image.

26. The method of claim 24, wherein the plurality of regions of the acquired image are associated with different focal planes, the method further comprising combining the plurality of regions of the acquired image to create an all-in-focus image.

27. An optical device for acquiring at least one image, the device comprising:

a first light modulator layer having a plurality of elements;

a plurality of lenses, wherein each of the plurality of lenses is disposed to receive light independently of each other and wherein each of the plurality of lenses corresponds to a unique subset of the plurality of elements of the first light modulator layer;

an image detector configured to acquire one image from the light that passes through at least one of the plurality of lenses and that comes from the first light modulator layer; and a controller configured to control the plurality of elements of the first light modulator layer, to cause the first light modulator layer to provide light that enters at least one first lens of the plurality of lenses to the image detector, and to stop providing light from the at least one first lens and provide light from at least one second lens of the plurality of lenses to the image detector.

* * * * *

UNITED STATES PATENT AND TRADEMARK OFFICE
CERTIFICATE OF CORRECTION

| | | |
|---|---|---|
| PATENT NO. | : 7,651,282 B2 | Page 1 of 1 |
| APPLICATION NO. | : 11/417864 | |
| DATED | : January 26, 2010 | |
| INVENTOR(S) | : Zomet et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 706 days.

Signed and Sealed this

Twenty-third Day of November, 2010

David J. Kappos
*Director of the United States Patent and Trademark Office*